(12) United States Patent
Larouche et al.

(10) Patent No.: US 11,697,872 B2
(45) Date of Patent: Jul. 11, 2023

(54) MULTI-LAYERED COATING SYSTEM FOR A SUBSTRATE AND METHOD OF MAKING THE SAME

(71) Applicant: GM GLOBAL TECHNOLOGY OPERATIONS LLC, Detroit, MI (US)

(72) Inventors: Guy D. Larouche, White Lake, MI (US); Margaret Ann Mcfarland, Royal Oak, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/356,123

(22) Filed: Jun. 23, 2021

(65) Prior Publication Data
US 2022/0411914 A1    Dec. 29, 2022

(51) Int. Cl.
| | | |
|---|---|---|
| *C23C 14/20* | (2006.01) | |
| *C23C 14/08* | (2006.01) | |
| *C23C 14/02* | (2006.01) | |
| *C23C 14/58* | (2006.01) | |
| *C23C 14/16* | (2006.01) | |

(52) U.S. Cl.
CPC .......... *C23C 14/20* (2013.01); *C23C 14/024* (2013.01); *C23C 14/08* (2013.01); *C23C 14/16* (2013.01); *C23C 14/58* (2013.01); *Y10T 428/31678* (2015.04)

(58) Field of Classification Search
None
See application file for complete search history.

(56) References Cited

U.S. PATENT DOCUMENTS

| | | | | |
|---|---|---|---|---|
| 7,078,076 B2 * | 7/2006 | Maze | ............. | C09D 5/10 |
| | | | | 427/376.6 |
| 8,084,119 B2 * | 12/2011 | Deng | ............. | G02F 1/133555 |
| | | | | 455/575.8 |
| 2002/0013401 A1 * | 1/2002 | Friel | ............. | B44D 3/08 |
| | | | | 524/502 |
| 2020/0290086 A1 * | 9/2020 | Xu | ............. | C08G 18/755 |
| 2020/0353736 A1 * | 11/2020 | Meizanis | ............. | D21H 27/10 |

FOREIGN PATENT DOCUMENTS

| | | |
|---|---|---|
| CN | 115505153 A | 12/2022 |
| DE | 102022108844 A1 | 12/2022 |

OTHER PUBLICATIONS

Fujichem Sonneborn Limited, "Exterior UV curable High gloss topcoat for PVD." Technical Data Sheet, Product No. 30:2010V7 (Oct. 2017).

(Continued)

*Primary Examiner* — Seth Dumbris
(74) *Attorney, Agent, or Firm* — Harness, Dickey & Pierce, P.L.C.

(57) ABSTRACT

A multi-layered coating system for a substrate and a method for preparing the multi-layered coating system are provided herein. The multi-layered coating system includes a substrate, a metallic layer disposed adjacent to at least a portion of the substrate, an adhesion layer disposed adjacent to at least a portion of the metallic layer, and a protective coating layer disposed adjacent to at least a portion of the adhesion layer. The metallic layer includes a metal, an oxide of the metal, or a combination thereof. The adhesion layer includes a silicate and latex.

13 Claims, 2 Drawing Sheets

(56) References Cited

OTHER PUBLICATIONS

Fujichem Sonneborn Limited, "Interior / Exterior UV curable basecoat for various plastic substrates." Technical Data Sheet, Product No. 34:430V3 (Feb. 2017).
OC Oerlikon Management AG, "What is ePD?" Oerlikon Balzers, https://www.oerlikon.com/balzers/us/en/portfolio/surface-technologies/pvd-based-processes/epd/about-epd/ (retrieved on Jun. 23, 2021).
RevolutionParts, Inc., "Exterior Emblem, Illuminated, Black—GM (84602325)." GM Parts Overstock, https://www.gmpartsoverstock.com/oem-parts/gm-exterior-emblem-illuminated-black-84602325 (retrieved on Jun. 23, 2021).

* cited by examiner ial coating system for a substrate and method of making the same

FIELD

This present disclosure is related generally to multi-layered coating systems, such as physical vapor deposition (PVD) coatings, for a substrate, which include an adhesion layer between a metallic layer and a protective coating, and methods of making said multi-layered coating systems.

INTRODUCTION

This section provides background information related to the present disclosure which is not necessarily prior art.

Decorative chrome plating has generally been used on plastic materials, such as plastic automotive components, in order to produce durable and aesthetically pleasing metallized coatings. However, the chrome plating process typically requires multiple steps and each step can require cleaning, polishing, buffing and rinsing. Furthermore, chrome plating is accomplished with hexavalent chromium, which, due to its high toxicity and classification as an air pollutant, requires that it must be handled and disposed of according to strict guidelines.

An alternative to chrome plating is the use of physical vapor deposition (PVD) coatings for providing thin metallized layers on plastic components. PVD coatings typically include a basecoat provided on a plastic substrate, followed by the PVD metallized layer, and covered with a transparent topcoat. The basecoat and topcoat may be ultraviolet (UV) curable coatings. The PVD metallized layer, such as chromium and/or zirconium metal, can be deposited onto a plastic substrate through changes in the physical state of the metal (i.e., solid to gas to solid). The PVD metallized layer can be deposited by a variety of methods, for example, via thermal evaporation or sputtering. However, these PVD coatings do not have the required durability to replace chrome plating. Thus, further PVD coatings are needed with increased adhesion to the substrate to improve durability of the PVD coatings, especially after undergoing weathering and humidity exposure.

SUMMARY

This section provides a general summary of the disclosure, and is not a comprehensive disclosure of its full scope or all of its features.

The present disclosure relates to multi-layered coating systems and methods of making said multi-layered coating systems.

In certain aspects, the present disclosure provides a multi-layered coating system for a substrate. The multi-layered coating system includes a substrate and a metallic layer, for example, a physical vapor deposition (PVD) layer, disposed adjacent to at least a portion of the substrate. The metallic layer includes a metal, an oxide of the metal, or a combination thereof. The metal can be selected from the group consisting of chromium, aluminum, zirconium, stainless steel, nickel, tin, indium, and a combination thereof. The multi-layered coating system further includes an adhesion layer disposed adjacent to at least a portion of the metallic layer, and a protective coating layer disposed adjacent to at least a portion of the adhesion layer. The adhesion layer includes a silicate, for example, a kaolin group mineral, and latex.

The metallic layer may have a thickness of about 50 nm to about 500 nm.

The silicate may be present in the adhesion layer in an amount of greater than about 50 wt %, based on total weight of the adhesion layer.

The adhesion layer may have a thickness of about 5 μm to about 15 μm.

The substrate may include a plastic, for example, polypropylene (PP), acrylonitrile butadiene styrene (ABS), polycarbonate (PC), poly(methyl methacrylate) (PMMA), polyamide (PA), polyphenylene ether (PPE), polybutylene terephthalate (PBT), a thermoplastic olefin (TPO), or a combination thereof. Additionally or alternatively, the substrate may include a metal, for example, stainless steel, chromium, aluminum, zirconium, nickel, tin, indium, or a combination thereof.

The substrate may be backlit.

The substrate may be a component for an automotive vehicle.

The protective coating layer may be transparent or tinted

The protective coating layer may have a thickness of about 10 μm to about 50 μm.

The multi-layered coating system may further include a primer layer disposed between confronting surfaces of the substrate and the metallic layer and the primer layer may have a thickness of 5 μm to about 30 μm.

Each of the primer layer and the protective coating layer can include a UV-cured polymer or a thermally cured polymer.

In yet other aspects, the present disclosure provides a method of preparing a multi-layered coating system for a substrate. The method includes depositing a metallic layer via physical vapor deposition onto at least a portion of the substrate. The metallic layer includes a metal, an oxide of the metal, or a combination thereof. The metal may be selected from the group consisting of chromium, aluminum, zirconium, stainless steel, nickel, tin, indium, and a combination thereof. The method may further include applying an adhesion layer onto at least a portion of the metallic layer, and applying a protective coating layer precursor onto at least a portion of the adhesion layer. The adhesion layer includes a silicate, for example, a kaolin group mineral, and latex. The method may further include cross-linking and/or solidifying the protective coating layer precursor to form a protective coating layer.

The silicate may be present in the adhesion layer in an amount of greater than about 50 wt %, based on total weight of the adhesion layer.

The metallic layer may have a thickness of about 50 nm to about 500 nm.

The adhesion layer may have a thickness of about 5 μm to about 15 μm.

The protective coating layer may have a thickness of about 10 μm to about 50 μm.

The substrate may include a plastic, for example, polypropylene (PP), acrylonitrile butadiene styrene (ABS), polycarbonate (PC), poly(methyl methacrylate) (PMMA), polyamide (PA), polyphenylene ether (PPE), polybutylene terephthalate (PBT), a thermoplastic olefin (TPO), or a combination thereof. Additionally or alternatively, the substrate may include a metal, for example, stainless steel, chromium, aluminum, zirconium, nickel, tin, indium, or a combination thereof.

The method may further include applying a primer layer precursor onto at least a portion of the substrate, depositing the metallic layer onto at least a portion of the primer layer precursor, and cross-linking and/or solidifying the primer layer precursor to form a primer layer. The primer layer may have thickness of about 5 µm to about 30 µm.

The solidifying and/or cross-linking may include applying heat, UV radiation, or both to the primer layer precursor and the protective coating precursor.

Further areas of applicability will become apparent from the description provided herein. The description and specific examples in this summary are intended for purposes of illustration only and are not intended to limit the scope of the present disclosure.

BRIEF DESCRIPTION OF THE DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
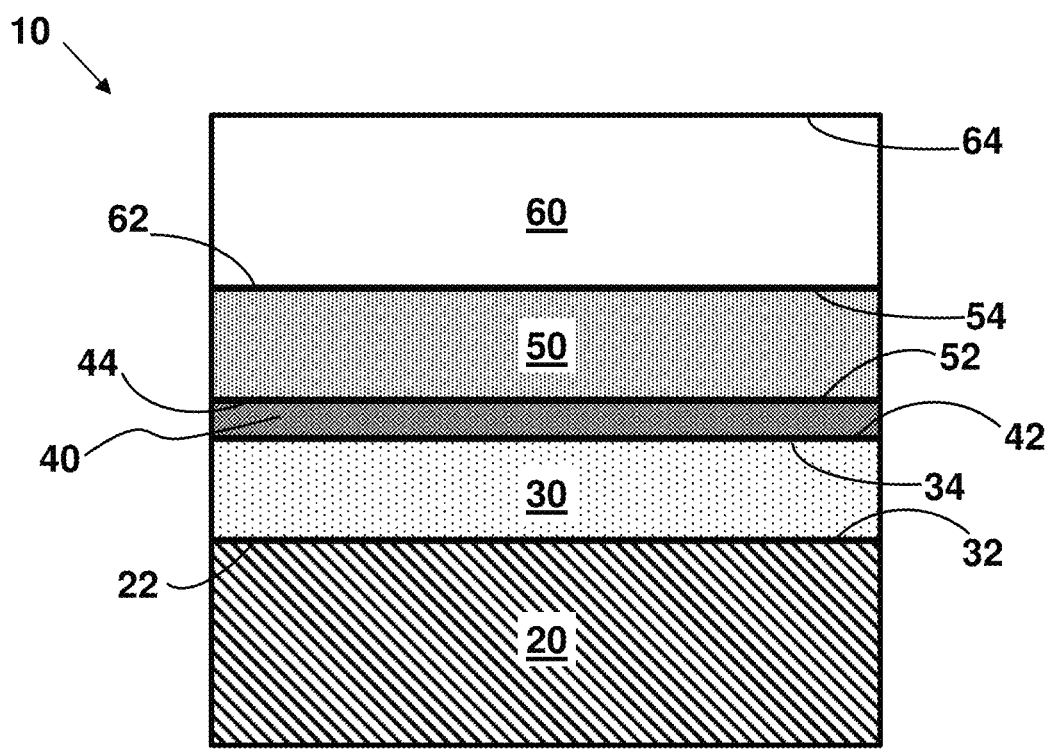
FIG. 1 is a cross-sectional view of an exemplary multi-layered coating system according to the present disclosure.

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or"consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will now be described more fully with reference to the accompanying drawings.

I. Multi-Layered Coating System

A multi-layered coating system for a substrate, such as a plastic substrate, is provided herein. FIG. 1 illustrates an exemplary multi-layered coating system 10 (also referred to as "coating system 10") including a substrate 20. In coating system 10, an optional primer layer 30 may be disposed adjacent to at least a portion of the substrate 20 having a first surface 22. The primer layer 30 may include a second surface 32 and an opposing third surface 34. For example, a second surface 32 of the primer layer 30 may be disposed adjacent to and/or present on at least a portion of first surface 22 of the substrate 20. Additionally or alternatively, a metallic layer 40 may be disposed adjacent to at least a portion of the third surface 34 of the primer layer 30. The metallic layer 40 may include a fourth surface 42 and an opposing fifth surface 44. For example, a fourth surface 42 of the metallic layer 40 may be disposed adjacent to and/or present on at least a portion of the third surface 34 of the primer layer 30. In other words, the primer layer 30 may be disposed between confronting surfaces of the substrate 20 and the metallic layer 30.

Figure 2:
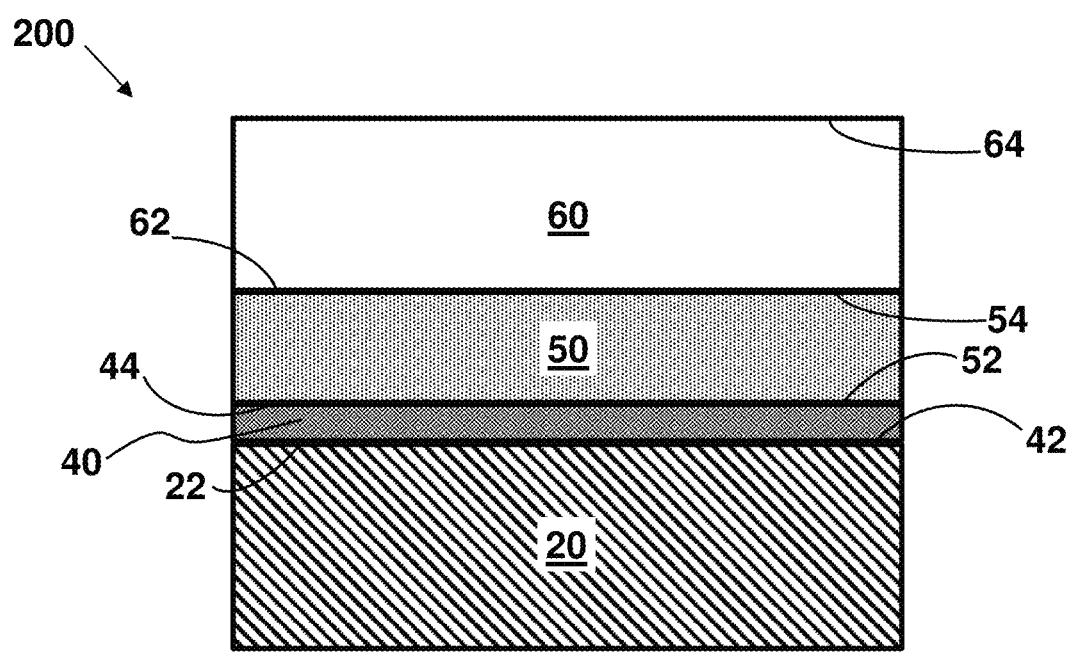
FIG. 2 is a cross-sectional view of an alternative exemplary multi-layered coating system according to the present disclosure.

Alternatively, as depicted in FIG. 2 in coating system 200, it is contemplated herein that the coating system 10 may not include primer layer 30 or primer layer 30 may be absent. Instead, the metallic layer 40 may be disposed adjacent to and/or present on a first surface 22 of the substrate 20. For example, a fourth surface 42 of the metallic layer 40 may be disposed adjacent to and/or present on at least a portion of the first surface 22 of substrate 20.

Additionally or alternatively, an adhesion layer 50 may be disposed adjacent to at least a portion of the fifth surface 44 of the metallic layer 40. The adhesion layer 50 may include a sixth surface 52 and an opposing seventh surface 54. For example, a sixth surface 52 of the adhesion layer 50 may be disposed adjacent to and/or present on at least a portion of the fifth surface 44 of the metallic layer 40. Additionally or alternatively, a protective coating layer 60 may be disposed adjacent to at least a portion of the seventh surface 54 of the adhesion layer 50. The protective coating layer 60 may include an eighth surface 62 and an opposing ninth surface 64. For example, an eighth surface 62 of the protective coating layer 60 may be disposed adjacent to and/or present on at least a portion of the seventh surface 54 of the adhesion layer 50. It is contemplated herein that each of the layers 30, 40, 50, and 60 may each be substantially continuous layers or substantially discontinuous layers.

In any embodiment, the substrate 20 may be a plastic substrate, a metal substrate, or a combination thereof. The substrate 20 may comprise any suitable plastic material and/or metal material. Examples of suitable plastic materials that may form the substrate 20 include, but are not limited to, polypropylene (PP), acrylonitrile butadiene styrene (ABS), polycarbonate (PC), poly(methyl methacrylate) (PMMA), polyamide (PA), polyphenylene ether (PPE), polybutylene terephthalate (PBT), a thermoplastic olefin (TPO) (e.g., polypropylene (PP), polyethylene (PE), block copolymer polypropylene (BCPP), etc.), or a combination thereof. For example, the substrate 20 may include ABS, PC, or a combination thereof. The plastic material may or may not include reinforcing fibers, such as carbon, basalt, glass, aramid, wood, or paper fibers. In any embodiment, the substrate 20 may be formed via injection molding, rotational molding, blow molding, compression molding, extrusion, or filament winding. Examples of suitable metal materials include, but are not limited to, stainless steel, chromium, aluminum, zirconium, nickel, tin, indium, and combinations and alloys thereof. Additionally or alternatively, the substrate 20 may be backlit. For example, the substrate 20 may be backlit via a lighted assembly, for example, including at least one LED.

The substrate 20 may be a plastic or metal component for a transportation vehicle, such as an automotive vehicle (e.g., cars, trucks, buses, motorcycles), a railed vehicle (e.g., trains, trams), a watercraft vehicle (e.g. boats, ships), an amphibious vehicle (e.g., hovercraft), an aircraft vehicle (e.g. airplanes, helicopters), a recreational vehicle (e.g., mobile homes, campers), an agricultural vehicle (e.g., tractors), a military vehicle (e.g., tanks), and a spacecraft vehicle. The plastic component for a transportation vehicle may be an interior component and/or an exterior component. Examples of such plastic or metal components include, but are not limited, to logos, mirrors, fenders, bumper accessories, grille components, exterior and/or interior decorative trim, tail light bezels and covers, door handles, panel covers, etc. It is also contemplated herein that the present technology may be employed in a wide variety of other industries and applications. For example, substrate 20 may be a plastic component for an electronic device, a consumer good, buildings (e.g., houses, offices, sheds, and warehouses), office equipment and furniture, industrial machinery, heavy machinery, and appliances.

In any embodiment, the optional primer layer 30 may comprise a polymer, such as an ultraviolet cured (UV-cured) polymer (also referred to as a UV-cured resin), a thermally cured polymer (also referred to as a thermally cured resin, thermosetting polymer, or thermoset), or a combination thereof. UV-cured polymers include acrylate functionalized oligomers and monomers, such as epoxides, urethanes, polyethers, polyesters, and silicones. Examples of UV-cured polymers include, but are not limited to, an epoxy acrylate, an acrylated polyester, an acrylated urethane, an acrylated silicone, an acrylated polyether, an acrylated styrene, and combinations thereof. Thermally cured polymers include, but are not limited to, an epoxy, a silicone, a polyurethane, a phenolic, a benzoxazine, a polyimide, an acrylic resin, a polyester, a vinyl ester, an amino resin, a furan resin, and combinations thereof. Additionally or alternatively, the primer layer 30 may include one or more of a photopolymerization initiator (e.g., benzophenone, xanthones, quinones, acetophenones, benzoin ethers, benxoyl oximes, acylphosphines, etc.), co-initiators (e.g., spectral sensitizer, reducing agents etc.), a catalyst and/or catalyst system, a cross-linking agent (e.g., isocyanate), and various additives, such as stabilizers, antioxidants, plasticizers, and pigments. In any embodiment, the primer layer 30 may have a thickness of greater than or equal to about 1 μm, greater than or equal to about 5 μm, greater than or equal to about 10 μm, greater than or equal to about 15 μm, greater than or equal to about 20 μm, greater than or equal to about 25 μm, greater than or equal to about 30 μm, greater than or equal to about 35 μm, greater than or equal to about 40 μm, greater than or equal to about 45 μm, or about 50 μm; or from about 1 μm to about 50 µm, about 1 µm to about 40 µm, about 1 µm to about 30 µm, about 1 µm to about 20 µm, about 1 µm to about 15 µm, about 5 µm to about 50 µm, about 5 µm to about 40 µm, about 5 µm to about 30 µm, about 5 µm to about 25 µm, about 5 µm to about 20 µm, about 5 µm to about 15 µm, or about 5 µm to about 10 µm.

In any embodiment, the metallic layer 40 may comprise any suitable metal, oxide of the metal, or combination thereof. Examples of suitable metals include, but are not limited to, chromium, aluminum, zirconium, stainless steel, nickel, tin, indium, and combinations and alloys thereof. Examples of metal oxides include, but are not limited to, a chromium oxide (e.g., $CrO$, $Cr_2O_3$, $CrO_2$, $CrO_3$, $CrO_5$, $Cr_8O_{21}$), aluminum oxide ($Al_2O_3$), zirconium oxide ($ZrO_2$), a nickel oxide (e.g., $NiO$, $Ni_2O_3$), and a tin oxide (e.g., $SnO$, $SnO_2$). For example, the metallic layer 40 may comprise chromium or a chromium zirconium alloy.

In various aspects, the metallic layer 40 may be a PVD layer. In other words, the metallic layer 40 may be formed by a PVD process as further described below. Thus, the metallic layer 40 may be a thin metallized layer. For example, the metallic layer 40 may have a thickness of greater than or equal to about 25 nm, greater than or equal to about 50 nm, greater than or equal to about 75 nm, greater than or equal to about 100 nm, greater than or equal to about 150 nm, greater than or equal to about 200 nm, greater than or equal to about 250 nm, greater than or equal to about 300 nm, greater than or equal to about 350 nm, greater than or equal to about 400 nm, greater than or equal to about 450 nm, greater than or equal to about 500 nm, greater than or equal to about 600 nm, or about 750 nm; or from about 25 nm to about 750 nm, about 25 nm to about 500 nm, about 25 nm to about 250 nm, about 25 nm to about 150 nm, about 50 nm to about 750 nm, about 50 nm to about 500 nm, about 50 nm to about 250 nm, about 50 nm to about 200 nm, about 50 nm to about 150 nm, about 100 nm to about 750 nm, about 100 nm to about 500 nm, about 100 nm to about 250 nm, about 100 nm to about 200 nm, or about 100 nm to about 150 nm.

In any embodiment, the adhesion layer 50 may comprise a silicate and a latex. The silicate may be a clay mineral (i.e., a hydrous aluminum phyllosilicate) such as, but not limited to, clay minerals selected from a kaolin group, a smectite group, an illite group (e.g., illite), a chlorite group, attapulgite, sepiolite, and combinations thereof. Examples of kaolin group minerals include, but are not limited to, kaolinite (or kaolin), dickite, halloysite, and nacrite. Examples of smectite group clay minerals include, but are not limited to, montmorillonite, nontronite, beidellite, and saponite. In an embodiment, the silicate may be kaolinite. In any embodiment, the latex may include water-based dispersion of sub-micrometer (µm) polymer particles. These aqueous dispersions can be prepared by emulsion polymerization. Additionally or alternatively, the latex may be one or more of a latex rubber material, for example, isoprene rubber, butadiene rubber, butyl rubber, ethylene propylene rubber, chloroprene rubber, epichlorohydrin rubber, acrylic rubber, urethane rubber, silicone rubber, fluorine rubber, styrene butadiene rubber, chlorosulfur fonated rubber, chlorinated polyethylene rubber, nitrile rubber, acrylonitrile rubber, acrylonitrile butadiene rubber, partially hydrogenated butadiene rubber, partially hydrogenated styrene butadiene rubber, hydrogenated acrylonitrile butadiene rubber, polysulfide rubber, acrylic acid ester, etc. Can be mentioned.

In the adhesion layer 50, the silicate may be present in an amount, based on total weight of the adhesion layer 50, of greater than or equal to about 30 wt %, greater than or equal to about 40 wt %, greater than or equal to about 50 wt %, greater than or equal to about 60 wt %, greater than or equal to about 70 wt %, greater than or equal to about 80 wt %, greater than or equal to about 90 wt %, or about 95 wt %; or from about 30 wt % to about 95 wt %, about 30 wt % to about 90 wt %, about 30 wt % to about 80 wt %, about 30 wt % to about 60 wt %, about 30 wt % to about 50 wt %, about 40 wt % to about 95 wt %, about 40 wt % to about 80 wt %, about 40 wt % to about 60 wt %, about 50 wt % to about 95 wt %, about 50 wt % to about 90 wt %, about 50 wt % to about 80 wt %, about 50 wt % to about 70 wt %, or about 50 wt % to about 60 wt %.

In any embodiment, the adhesion layer 50 may have a thickness of greater than or equal to about 1 µm, greater than or equal to about 5 µm, greater than or equal to about 10 µm, greater than or equal to about 15 µm, greater than or equal to about 20 µm, greater than or equal to about 25 µm, greater than or equal to about 30 µm, greater than or equal to about 35 µm, greater than or equal to about 40 µm, greater than or equal to about 45 µm, or about 50 µm; or from about 1 µm to about 50 µm, about 1 µm to about 40 µm, about 1 µm to about 30 µm, about 1 µm to about 20 µm, about 1 µm to about 15 µm, about 5 µm to about 50 µm, about 5 µm to about 40 µm, about 5 µm to about 30 µm, about 5 µm to about 25 µm, about 5 µm to about 20 µm, about 5 µm to about 15 µm, or about 5 µm to about 10 µm. It has been discovered that inclusion of adhesion layer 50 between metallic layer 40 and protective coating layer 60 can advantageously result in increased adhesion of the metallic layer 40 to the substrate 20, which can allow for increased durability of the coating system, for example, even in humid environments and after weathering. Also, inclusion of the adhesion layer 50 can allow for use of a protective coating layer 60 comprising a thermally cured polymer as further described below.

In any embodiment, the protective coating layer 60 may comprise a polymer, such as an ultraviolet cured (UV-cured) polymer (also referred to as a UV-cured resin), a thermally cured polymer (also referred to as a thermally cured resin, thermosetting polymer, or thermoset), or a combination thereof. UV-cured polymers include acrylate functionalized oligomers and monomers, such as epoxides, urethanes, polyethers, polyesters, and silicones. Examples of UV-cured polymers include, but are not limited to, an epoxy acrylate, an acrylated polyester, an acrylated urethane, an acrylated silicone, an acrylated polyether, an acrylated styrene, and combinations thereof. Thermally cured polymers include, but are not limited to, an epoxy, a silicone, a polyurethane, a phenolic, a benzoxazine, a polyimide, an acrylic resin, a polyester, a vinyl ester, an amino resin, a furan resin, and combinations thereof. Additionally or alternatively, the protective coating layer 30 may include one or more of a photo-polymerization initiator (e.g., benzophenone, xanthones, quinones, acetophenones, benzoin ethers, benxoyl oximes, acylphosphines, etc.), co-initiators (e.g., spectral sensitizer, reducing agents etc.), a catalyst, a cross-linking agent (e.g., isocyanate), and various additives, such as stabilizers, antioxidants, plasticizers, and pigments. In any embodiment, the protective coating layer 60 may have a thickness of greater than or equal to about 1 µm, greater than or equal to about 5 µm, greater than or equal to about 10 µm, greater than or equal to about 15 µm, greater than or equal to about 20 µm, greater than or equal to about 25 µm, greater than or equal to about 30 µm, greater than or equal to about 35 µm, greater than or equal to about 40 µm, greater than or equal to about 45 µm, greater than or equal to about 50 µm, greater than or equal to about 60 µm, or about 70 µm; or from about 1 µm to about 70 µm, about 1 µm to about 60 µm, about 1 µm to about 50 µm, about 5 µm to about 70 µm, about 5 µm to about 60 µm, about 5 µm to about 50 µm, about 5 µm to about 40 µm, about 5 µm to about 30 µm, about 10 µm to about 70 µm, about 10 µm to about 60 µm, about 10 µm to about 50 µm, about 10 µm to about 40 µm, about 10 µm to about 30 µm, about 20 µm to about 50 µm, about 20 µm to about 40 µm, about 20 µm to about 30 µm, or about 25 µm to about 30 µm.

The protective coating layer 60 may be transparent or tinted, for example via commercially available pigments. It is contemplated herein that the primer layer 30 and the protective coating layer 60 may be the same or different. Advantageously, if the primer layer 30 and the protective coating layer 60 are the same type of polymer, they may both be solidified and/or cross-linked via the same curing process, for example, UV curing or thermal curing.

II. Methods for Preparing a Multi-Layered Coating System

Methods for preparing a multi-layered coating system, such as coating system 10, for a substrate, such as substrate 20, are provided herein. A method includes depositing a metallic layer as described herein (e.g., metallic layer 40) via physical vapor deposition (PVD) onto at least a portion of the substrate (e.g., substrate 20). PVD refers to techniques utilizing physical methods for depositing metal films or coatings. PVD is characterized by a process in which the material goes from a condensed phase to a vapor phase and then back to a thin film condensed phase. The metallic layer may include a metal as described herein (e.g., chromium, aluminum, zirconium, stainless steel, nickel, tin, and a combination thereof), an oxide of the metal as described herein, or a combination thereof. Optionally, the method may include applying a primer layer precursor onto at least a portion of a substrate as described herein (e.g., substrate 20) and depositing a metallic layer as described herein (e.g., metallic layer 40 via physical vapor deposition onto at least a portion of the primer layer precursor.

The method may further include applying an adhesion layer as described herein (e.g., adhesion layer 50) onto at least a portion of the metallic layer, and applying a protective coating layer precursor onto at least a portion of the adhesion layer. The primer layer precursor, if present, and the protecting coating layer precursor each may be cross-linked and/or solidified to form a primer layer as described herein (e.g., primer layer 30) and a protective coating layer as described herein (e.g., protective coating layer 60).

Any suitable PVD method known to one of ordinary skill in the art may be used to deposit the metallic layer. For example, thermal evaporation or sputtering techniques, which both may be performed in a vacuum, can be used to deposit the metallic layer. The thermal evaporation process is a deposition of a metal via thermal vaporization in a vacuum environment. The metal may be in the form of a cane, which can be placed inside a metal coil, such as a tungsten coil. The number of coils can vary depending on size of the chamber. Once a vacuum is established in the chamber, the metal filaments (e.g., tungsten filaments) are heated to a temperature high enough to melt the metal. The power to the filaments is then increased further, for example, about double the temperature, and the metal is evaporated. The metal then re-condenses to form the metallic layer on the parts, for example, a substrate as described herein, optionally, including the primer layer precursor as described herein, in the chamber. Thickness of the metallic layer can vary depending on the cycle time and power applied to the target.

The sputtering process is a deposition process where atoms on a solid metal target are ejected into the gas phase due to bombardment of the material by high energy ions. The bombardment releases atoms from the metal target, which are deposited directly onto the part, for example, a substrate as described herein, optionally, including the primer layer precursor as described herein, within the vacuum chamber. Alloys can be deposited via thermal evaporation or sputtering. However, with thermal evaporation, the first metal with the lowest melt temperature will evaporate first and deposit first followed by the second metal with the higher melt temperature to form two distinct metal layers.

In any embodiment, the adhesion layer may be applied via spraying onto the metallic layer. For example, a slurry or solution including a silicate as described herein and latex as described herein with a suitable solvent may be sprayed onto the metallic layer. The adhesion layer may be sprayed by conventional painting techniques, for example, with a spray gun or bell, with or without the use of electrostatics. The adhesion layer may be applied in an inert atmosphere and undergo drying for a suitable amount of time at a suitable temperature to remove the solvent.

Both the primer layer (e.g., primer layer 30) (if present) and the protective coating layer (e.g., protective coating layer 60) may be formed by conventional polymerization techniques known by those of ordinary skill in the art. As used herein, the terms "primer layer precursor" and "protective coating layer precursor" refer to the pre-polymers, oligomers, monomers, or monomer or oligomer systems that can form any one of the UV-cured polymers or thermally cured polymers as disclosed above. For example, to form a primer layer including a UV-cured polymer or a protective coating layer including a UV-cured polymer, each of the primer layer precursor and the protective coating layer precursor may include monomers (e.g., epoxy, polyester, urethane, silicone, polyether, and/or styrene) and acrylate oligomers along with a photo-polymerization initiator. In another example, to form a primer layer including a thermally cured polymer, such as polyurethane, or a protective coating layer including a thermally cured polymer, such as polyurethane, each of the primer layer precursor and the protective coating layer precursor may include a polyol and a cross-linking agent (e.g., isocyanate) along with a catalyst (e.g., tertiary amine). The primer layer precursor may be applied to a substrate as described herein, and the protective coating layer precursor may be applied to the adhesion layer as described herein. For example, application can include spraying or casting of the precursors. Following application, solidifying and/or cross-linking of the primer layer precursor and/or the protective coating layer precursor can be accomplished by applying UV radiation to the primer layer precursor and/or the protective coating layer, for example, to form a UV-cured polymer, or by applying heat (e.g., in an oven) to form the primer layer precursor and/or the protective coating layer, for example, to form a thermally cured polymer. It is contemplated herein that the primer layer precursor and the protective coating layer precursor can be solidified and/or cross-linked via the same process (e.g., via heating or UV radiation) at the same time or at different times. For example, both the primer layer precursor and the protective coating layer precursor may be solidified and/or cross-linked via heating at substantially the same time or in sequential steps. Alternatively, the primer layer precursor and the protective coating layer precursor can be solidified and/or cross-linked via different processes (e.g., via heating or UV radiation) at different times. For example, the primer layer precursor may be solidified and/or cross-linked via heating followed by solidifying and/or cross-linking the protective coating layer precursor via exposure to UV radiation. Also, it is contemplated herein that the protective coating layer precursor and optional primer layer precursor, can be solidified and/or cross-linked at the same time via the same process (e.g., heating) as the adhesion layer. Alternatively, the adhesion layer may be heated/dried and followed by application and solidifying and/or cross-linking of the protective coating precursor.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A multi-layered coating system for a substrate comprising:
   a substrate;
   a metallic layer disposed adjacent to at least a portion of the substrate, wherein the metallic layer comprises a metal, an oxide of the metal, or a combination thereof, wherein the metal is selected from the group consisting of chromium, aluminum, zirconium, stainless steel, nickel, tin, indium and a combination thereof and wherein the metallic layer has a thickness of about 50 nm to about 500 nm;
   an adhesion layer disposed adjacent to at least a portion of the metallic layer, wherein the adhesion layer comprises a silicate and latex and wherein the silicate is present in the adhesion layer in an amount of greater than about 70 wt. %, based on total weight of the adhesion layer; and
   a protective coating layer disposed adjacent to at least a portion of the adhesion layer.

2. The multi-layered coating system of claim 1, wherein the metallic layer is a physical vapor deposition (PVD) layer.

3. The multi-layered coating system of claim 1, wherein the silicate is a kaolin group mineral.

4. The multi-layered coating system of claim 1, wherein the adhesion layer has a thickness of about 5 µm to about 15 µm.

5. The multi-layered coating system of claim 1, wherein the substrate comprises a plastic comprising polypropylene (PP), acrylonitrile butadiene styrene (ABS), polycarbonate (PC), poly(methyl methacrylate) (PMMA), polyamide (PA), polyphenylene ether (PPE), polybutylene terephthalate (PBT), a thermoplastic olefin (TPO), or a combination thereof, and/or wherein the substrate comprises a metal comprising stainless steel, chromium, aluminum, zirconium, nickel, tin, indium, or a combination thereof.

6. The multi-layered coating system of claim 1, wherein the substrate is backlit.

7. The multi-layered coating system of claim 1, wherein the substrate is a component for an automotive vehicle.

8. The multi-layered coating system of claim 1, wherein the protective coating layer is transparent or tinted.

9. The multi-layered coating system of claim 1, wherein the protective coating layer has a thickness of about 10 µm to about 50 µm.

10. The multi-layered coating system of claim 1, further comprising a primer layer disposed between confronting surfaces of the substrate and the metallic layer, wherein the primer layer has a thickness of 5 µm to about 30 µm.

11. The multi-layered coating system of claim 10, wherein each of the primer layer and the protective coating layer comprise a UV-cured polymer or a thermally cured polymer.

12. The multi-layered coating system of claim 1, wherein the adhesion layer consists of the silicate and latex.

13. A multi-layered coating system for a substrate comprising:
   a substrate;
   a metallic layer disposed adjacent to at least a portion of the substrate, wherein the metallic layer comprises a metal, an oxide of the metal, or a combination thereof, wherein the metal is selected from the group consisting of chromium, aluminum, zirconium, stainless steel, nickel, tin, indium and a combination thereof;
   an adhesion layer disposed adjacent to at least a portion of the metallic layer, wherein the adhesion layer consists of a silicate and latex; and
   a protective coating layer disposed adjacent to at least a portion of the adhesion layer.

* * * * *